(12) United States Patent
Elian et al.

(10) Patent No.: US 11,561,245 B2
(45) Date of Patent: Jan. 24, 2023

(54) SENSOR APPARATUSES WITH A BYPASS CURRENT PATH AND ASSOCIATED PRODUCTION METHODS

(71) Applicant: Infineon Technologies AG, Neubiberg (DE)

(72) Inventors: Klaus Elian, Alteglofsheim (DE); Rainer Markus Schaller, Saal a.d. Donau (DE); Volker Strutz, Tegernheim (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/217,390

(22) Filed: Mar. 30, 2021

(65) Prior Publication Data

US 2021/0302474 A1  Sep. 30, 2021

(30) Foreign Application Priority Data

Mar. 31, 2020 (DE) .......................... 102020108880.9

(51) Int. Cl.
*G01R 15/20* (2006.01)
*G01R 19/00* (2006.01)
*G01R 33/07* (2006.01)

(52) U.S. Cl.
CPC ......... *G01R 15/202* (2013.01); *G01R 15/207* (2013.01); *G01R 19/0092* (2013.01); *G01R 33/07* (2013.01)

(58) Field of Classification Search
CPC .... G01R 15/202; G01R 15/207; G01R 33/07; G01R 33/0092; G01R 33/0029; G01R 33/0082; G01R 33/04; G01R 33/093; G01R 33/096
See application file for complete search history.

(56) References Cited

U.S. PATENT DOCUMENTS

| | | | |
|---|---|---|---|
| 6,310,470 B1 * | 10/2001 | Hebing | G01R 15/205 324/117 R |
| 10,290,554 B2 * | 5/2019 | Racz | H01L 23/49503 |
| 2005/0012496 A1 | 1/2005 | Taniguchi | |
| 2006/0219436 A1 | 10/2006 | Taylor et al. | |
| 2009/0021249 A1 | 1/2009 | Kumar et al. | |

(Continued)

FOREIGN PATENT DOCUMENTS

| | | |
|---|---|---|
| DE | 112012002932 T5 | 4/2014 |
| DE | 112018001815 T5 | 12/2019 |
| WO | 2006/040719 A1 | 4/2006 |

*Primary Examiner* — Dominic E Hawkins
(74) *Attorney, Agent, or Firm* — Harrity & Harrity, LLP

(57) ABSTRACT

A sensor apparatus comprises an electrically conductive chip carrier comprising a busbar, a first connection and a second connection, and a differential magnetic field sensor chip which is arranged on the chip carrier and has two sensor elements. The form of the busbar is such that a measurement current path running from the first connection to the second connection through the busbar comprises a main current path and a bypass current path, wherein the main current path and the bypass current path run parallel to one another, and a bypass current flowing through the bypass current path is less than a main current flowing through the main current path. The magnetic field sensor chip is configured to capture a magnetic field induced by the bypass current.

18 Claims, 7 Drawing Sheets

(56) References Cited

U.S. PATENT DOCUMENTS

2010/0156394 A1* 6/2010 Ausserlechner ..... G01R 15/202
  324/144
2013/0265037 A1* 10/2013 Friedrich ............... G01R 33/09
  324/207.2
2019/0386206 A1* 12/2019 Schaller .................. H01L 43/14

* cited by examiner the sensor elements 14.

SENSOR APPARATUSES WITH A BYPASS CURRENT PATH AND ASSOCIATED PRODUCTION METHODS

CROSS REFERENCE TO RELATED APPLICATION

This application claims priority to German Patent Application No. 102020108880.9 filed on Mar. 31, 2020, the content of which is incorporated by reference herein in its entirety.

TECHNICAL FIELD

The present disclosure relates to sensor apparatuses with a bypass current path and to methods for producing such sensor apparatuses.

BACKGROUND

In sensor apparatuses, sensor chips may be mounted on metal carriers with a busbar. The sensor chips may be configured to capture magnetic fields induced by an electrical current flowing through the busbar. Such sensor apparatuses may be used, for example, in automotive applications or power applications.

SUMMARY

Various aspects relate to a sensor apparatus that may cover a wide range of measurable current intensities. The sensor apparatus comprises an electrically conductive chip carrier comprising a busbar, a first connection and a second connection. The sensor apparatus also comprises a differential magnetic field sensor chip which is arranged on the chip carrier and has two sensor elements. The form of the busbar is such that a measurement current path running from the first connection to the second connection through the busbar comprises a main current path and a bypass current path, wherein the main current path and the bypass current path run parallel to one another, and a bypass current flowing through the bypass current path is less than a main current flowing through the main current path. The magnetic field sensor chip is configured to capture a magnetic field induced by the bypass current.

Various aspects relate to a method for producing a sensor apparatus. The method comprises forming an electrically conductive chip carrier comprising a busbar, a first connection and a second connection. The method also comprises arranging a differential magnetic field sensor chip having two sensor elements on the chip carrier. The form of the busbar is such that a measurement current path running from the first connection to the second connection through the busbar comprises a main current path and a bypass current path, wherein the main current path and the bypass current path run parallel to one another, and a bypass current flowing through the bypass current path is less than a main current flowing through the main current path. The magnetic field sensor chip is configured to capture a magnetic field induced by the bypass current.

BRIEF DESCRIPTION OF THE DRAWINGS

Sensor apparatuses and methods for producing sensor apparatuses according to the disclosure are explained in more detail below on the basis of drawings. The elements shown in the drawings are not necessarily represented in a manner true to scale relative to one another. Identical reference signs may denote identical components.

DETAILED DESCRIPTION

Figure 1A:
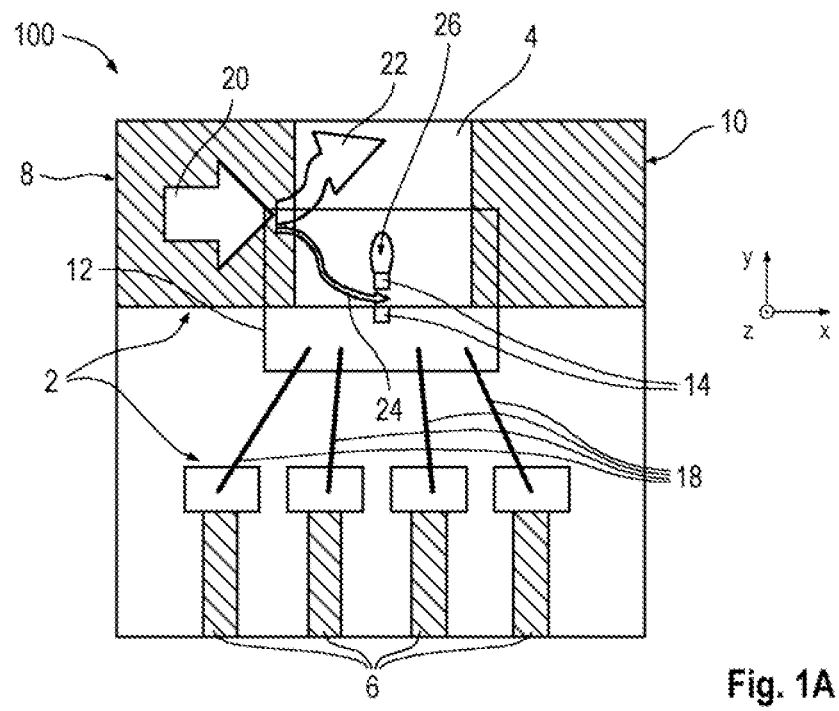
FIGS. 1A and 1B show a plan view and a view from below of a sensor apparatus 100 according to the disclosure.
Figure 1B:
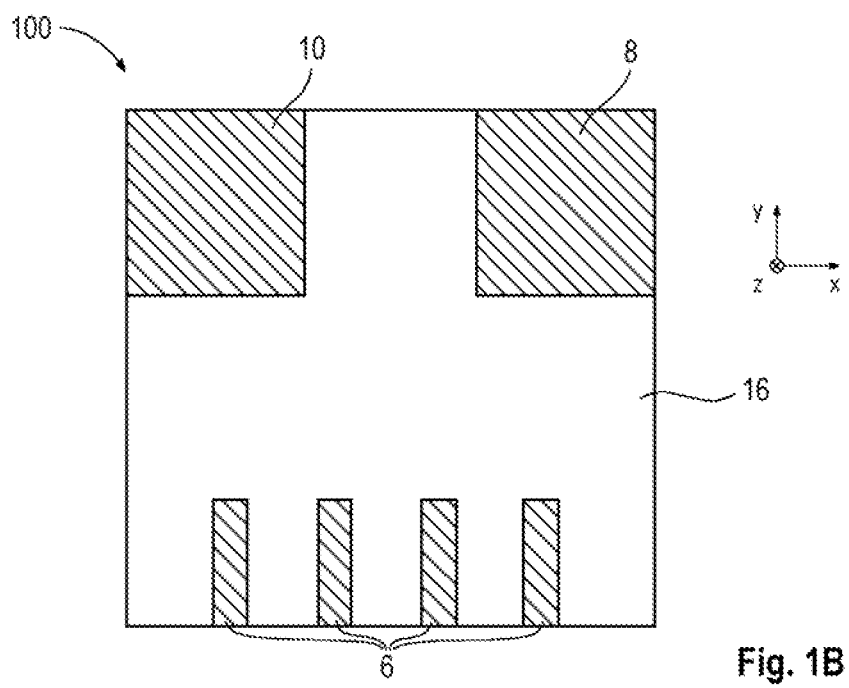

FIGS. 1A and 1B respectively show a plan view and a view from below of a sensor apparatus 100 according to the disclosure. The plan view in FIG. 1A illustrates an internal structure of the sensor apparatus 100. The sensor apparatus 100 in FIGS. 1A and 1B may have an electrically conductive chip carrier 2 having a busbar 4 and a plurality of connection conductors 6. The busbar 4 may have a first connection 8 and a second connection 10, at which an electrical current can be fed into the busbar 4 and can be output. A differential magnetic field sensor chip 12 having two sensor elements 14 may be arranged on the chip carrier 2. The magnetic field sensor chip 12 and its sensor elements 14 may be configured to capture magnetic fields. The components of the sensor apparatus 100 may be at least partially encapsulated by an encapsulation material 16.

In the example in FIGS. 1A and 1B, the chip carrier 2 may be a leadframe which forms the busbar 4 and the connection conductors 6. The leadframe may be manufactured, for example, from copper, nickel, aluminum or stainless steel. The chip carrier 2 may have different thicknesses in the z direction. In this context, the chip carrier 2 may be a half-etched leadframe. In FIGS. 1A and 1B, regions of the chip carrier 2 with a greater thickness are illustrated with hatching and regions with a lower thickness are illustrated without hatching. The thinner regions of the chip carrier 2 are not visible in the view from below in FIG. 1B.

The magnetic field sensor chip 12 may be an integrated circuit, with the result that it is also possible to refer to a magnetic field sensor IC. In the example in FIGS. 1A and 1B, the magnetic field sensor chip 12 may be a Hall sensor or a Hall IC. In further examples (cf. FIGS. 3A and 3B), the magnetic field sensor chip 12 may be an xMR sensor, in particular an AMR sensor, a GMR sensor or a TMR sensor. In the case of a Hall sensor, the sensor elements 14 may be Hall elements or Hall sensor elements which can be integrated in the circuit. Signal amplification, analog/digital conversion, digital signal processing and offset and temperature compensation can also be carried out in the Hall IC. In addition to the Hall plates, the components for the signal amplification and/or analog/digital conversion may or may not be considered to be part of the sensor elements 14. The magnetic field sensor chip 12 may be, in particular, a differential magnetic field sensor chip which can provide a difference between the magnetic field strengths respectively captured in the sensor elements 14.

The magnetic field sensor chip 12 may be electrically connected to the connection conductors 6 via one or more electrical connecting elements 18. The connection conductors 6 may therefore also be referred to as sensor connections or sensor pins. FIGS. 1A and 1B show, by way of example, four electrical connecting elements 18 in the form of bonding wires. In further examples, the electrical connecting elements 18 may be configured differently, for example as clips or strips, and their number may differ from the example in FIGS. 1A and 1B.

One or more of the apparatus components may be encapsulated by the encapsulation material 16 and may thereby be protected from external influences such as dirt or moisture. In other words, the encapsulation material 16 may form a housing for the magnetic field sensor chip 12, in particular, with the result that the sensor apparatus 100 can also be referred to as a sensor package. The encapsulation material 16 may be manufactured, for example, from a laminate, an epoxy resin, a thermoplastic or a thermosetting polymer. It is clear from the view from below in FIG. 1B that the connections 8 and 10 and the connection conductors 6 may be at least partially uncovered by the encapsulation material 16. Electrical contact can therefore be made with the busbar 4 and the magnetic field sensor chip 12 from outside the encapsulation material 16. The sensor apparatus 100 may be a "leadless" package. The sensor apparatus 100 may be electrically connected to a circuit board (not shown) via the connections which are exposed on the underside.

During operation of the sensor apparatus 100, a measurement current can be fed into the busbar 4 at the first connection 8. The measurement current can flow along a measurement current path 20 through the busbar 4 from the first connection 8 to the second connection 10 and can be output at the latter. In FIGS. 1A and 1B, the measurement current path 20 or the associated measurement current is indicated by a thick arrow on the left which is intended to represent the vectorial electrical current density j. The busbar 4 may be configured in such a manner that the measurement current path 20 running from the first connection 8 to the second connection 10 through the busbar 4 comprises a main current path 22 and a bypass current path 24. The main current path 22 and the bypass current path 24 may run substantially parallel to one another.

In the example in FIGS. 1A and 1B, a division of the measurement current path 20 into the main current path 22 and the bypass current path 24 may be provided by an opening (or a hole) 26 formed in the busbar 4. The main current path 22 and the bypass current path 24 may be separated from one another by the opening 26. In this case, the opening 26 may extend completely through the busbar 4 in the z direction. The opening 26 may be arranged closer to the lower edge of the busbar 4, that is to say may be offset downward with respect to the y direction. As a result, that section of the busbar 4 which forms the bypass current path 24 may be thinner than that section of the busbar 4 which forms the main current path 22. In the example in FIGS. 1A and 1B, the opening 26 may have a round or oval shape. In further examples, the shape of the opening 26 may be selected differently as desired, for example rectangular or square.

The busbar 4 may have no contact resistance along the bypass current path 24 on the chip carrier 2. A contact resistance can be defined or specified as electrical resistance which, when connecting components or materials, arises between these components at the contact point. A contact resistance may arise as a result of any type of connection which is used to connect different materials to one another, for example soldered connections, plug connections, switching connections, line connections, etc. Contact resistances may depend on the materials used and on the quality and type of the resulting contact points. Any contact resistance can result in a loss of energy. In addition, the materials used may be affected by the contact points and may wear out more quickly as a result. On account of the absence of contact resistances along the bypass current path 24, the defects mentioned can therefore be at least partially avoided in sensor apparatuses and busbars according to the disclosure. In comparison with conventional sensor apparatuses, corresponding ageing processes, in particular, can be avoided or at least delayed. In particular, a calibration of the sensor apparatus 100 may remain substantially constant over its service life.

In accordance with the statements above, the busbar 4 may therefore be free of contact points or connecting points along the bypass current path 24 on the chip carrier 2. The division of the measurement current path 20 into the main current path 22 and the bypass current path 24 can be provided solely by the form of the busbar 4. There is no need for any additional components, the formation of which may result in contact resistances. The bypass current path 24 may run, in particular, within the encapsulation material 16. Therefore, there can be no contact resistances along the bypass current path 24, in particular within the encapsulation material 16. For example, no shunt resistors, the contact points of which with respect to the busbar 4 would result in contact resistances, can be used along the bypass current path 24 in sensor apparatuses according to the disclosure. According to the disclosure, contact resistances can be avoided, for example, by virtue of the busbar 4 being manufactured as an integral single-piece component. In particular, the chip carrier 2 can be manufactured completely from a homogeneous metal and/or a homogeneous metal alloy. The main current path 22 and the bypass current path 24 can therefore run along a similar or identical material.

A measurement current fed into the busbar 4 at the first connection 8 can be divided into a main current and a bypass current on account of the form of the busbar 4. In this case, the measurement current may be greater than approximately 15 A, more precisely greater than approximately 20 A, and even more precisely greater than approximately 25 A. The bypass current may be less than the main current. An intensity of the bypass current may be, for example, at least approximately 10 times less, more precisely at least approximately 15 times less, and even more precisely at least approximately 20 times less than a strength of the main current. An electrical resistance of the busbar 4 along the bypass current path 24 may be greater than an electrical resistance of the busbar 4 along the main current path 22. A circuit diagram of a busbar according to the disclosure with electrical resistances which occur therein is shown and described in FIG. 7.

The magnetic field sensor chip 12 may be arranged above the bypass current path 24 and may therefore be configured to capture a magnetic field induced by the bypass current, in particular to measure the associated magnetic field strength. Ideally, such a measurement can be independent of a magnetic field induced by the main current. The intensity of the bypass current can be inferred from the strength of the captured magnetic field. Since the intensity of the bypass current and the intensity of the measurement current may depend on one another, in particular constantly, the intensity of the measurement current can also be inferred. The intensities of the bypass current and of the measurement current may linearly depend on one another, in particular. Since the intensity of the bypass current may be considerably less than the intensity of the measurement current, a wide range of measurement current intensities can be measured by the sensor apparatus 100. In comparison with conventional sensor apparatuses, higher measurement currents can be measured, in particular. Alternatively or additionally, a wide measurement range can be provided by arranging a second magnetic field sensor chip (not shown) above the main current path 22.

In the example in FIGS. 1A and 1B, the two sensor elements 14 may comprise two Hall sensor elements or may correspond to such elements. The bypass current path 24 may run between these two Hall sensor elements. In the plan view in FIG. 1A, the bypass current path 24 and the sensor elements 14 may each be (at least partially) free of an overlap. This makes it possible to ensure that the magnetic field induced by the bypass current has a component perpendicular to the respective Hall sensor element at the location of the sensor elements 14. At the position of the upper and lower sensor elements 14, respectively, the bypass current can induce a magnetic field pointing out of the x-y plane and a magnetic field pointing into the x-y plane. The directions of the magnetic fields induced in the sensor elements 14 can therefore be opposite. In one example, the bypass current path 24 and the sensor elements 14 may each be completely free of an overlap. In a further example, the bypass current path 24 and the sensor elements 14 may each overlap slightly. In this case, the bypass current path 24 and the sensor elements 14 may be at least approximately 80%, more precisely at least approximately 85%, more precisely at least approximately 90%, even more precisely at least approximately 95% free of an overlap.

In the example in FIGS. 1A and 1B, the upper sensor element 14 may be arranged on an edge of the opening 26 and the lower sensor element 14 may be arranged on an edge of the busbar 4. A connecting line between the two sensor elements 14 may run substantially perpendicular to the bypass current path 24 and may intersect the latter. In a similar manner, a connecting line between the two sensor elements 14 may run substantially perpendicular to the main current path 22. A distance between the sensor elements 14 in the y direction may be less than approximately 5 mm, more precisely less than approximately 4 mm, even more precisely less than approximately 3 mm. A dimension of that section of the busbar 4 which forms the bypass current path 24 in the y direction may have identical or similar values. In comparison with sensor elements of conventional magnetic field sensor chips, the distance between the sensor elements 14 may be reduced. As a result, small magnetic field sensor chips can be used in sensor apparatuses according to the disclosure. Furthermore, on account of the short distance between the sensor elements 14, measured value distortions which are caused by stray fields and can occur in differential magnetic field sensor chips can be prevented or at least reduced.

The sensor apparatus 100 may optionally have a switch (not shown) which is configured to switch between a differential measurement mode of the magnetic field sensor chip 12 and a non-differential measurement mode of the magnetic field sensor chip 12. The measurement mode can be changed over if the captured strength of the magnetic field induced by the bypass current exceeds a predefined threshold value. In the case of low magnetic field strengths in particular, it is possible to switch to the non-differential measurement mode of the magnetic field sensor chip 12, that is to say if the strength of the captured magnetic field is less than a predefined threshold value. Such changeover of the measurement mode can be provided by a Hall switch, for example. A Hall switch can be configured to measure the magnetic field strength and to compare it with a predefined or programmable fixed threshold value. As soon as the threshold value is exceeded, the switching point has been reached and it is possible to switch between the measurement modes. In one example, the non-differential measurement mode of the magnetic field sensor chip 12 can be provided by one of the two sensor elements 14. In a further example, the sensor apparatus 100 may have an additional mono-Hall sensor element (not shown) for the non-differential measurement mode.

Figure 2A:
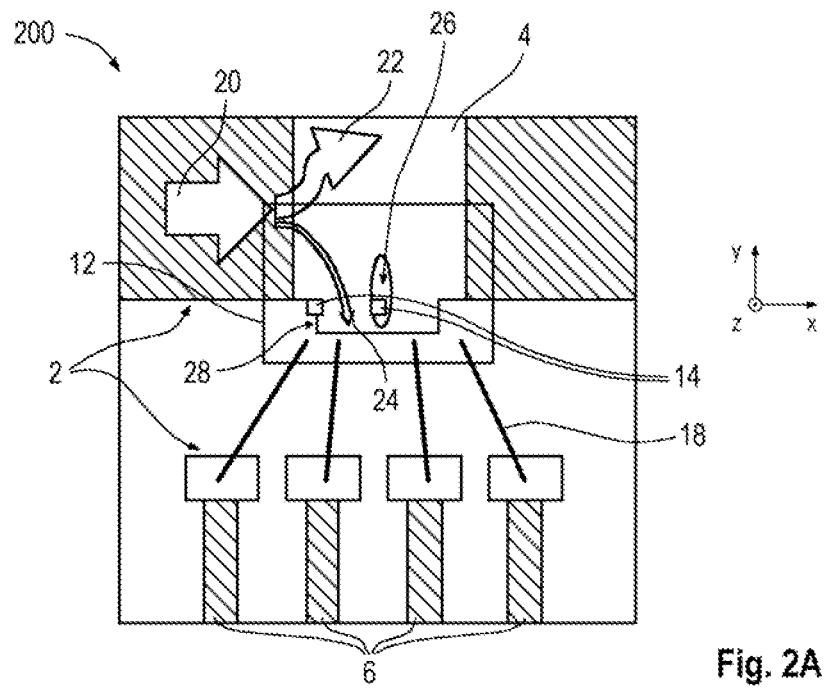
FIGS. 2A and 2B show a plan view and a view from below of a sensor apparatus 200 according to the disclosure.
Figure 2B:
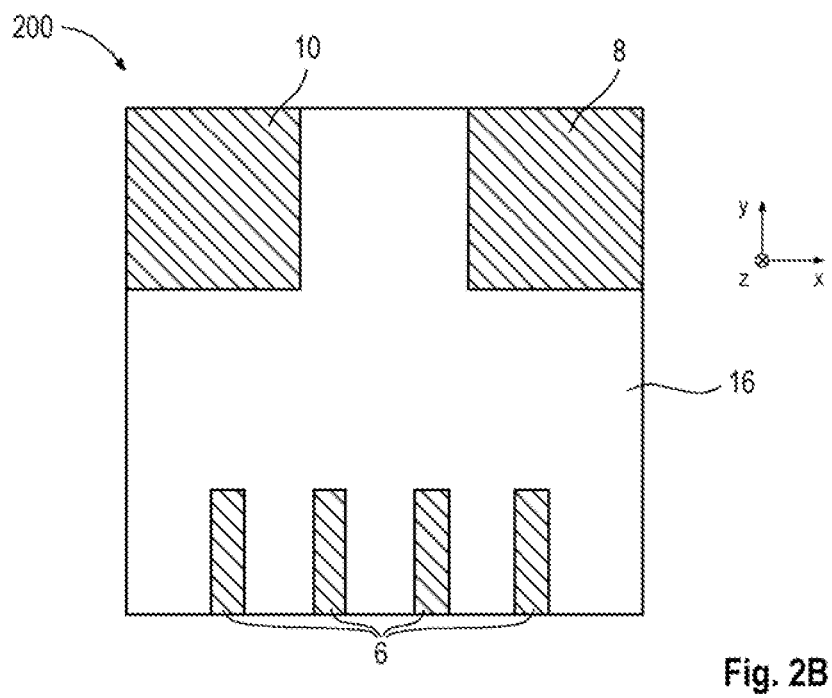

The sensor apparatus 200 in FIGS. 2A and 2B may be at least partially similar to the sensor apparatus 100 in FIGS. 1A and 1B and may have similar components. In particular, the two sensor elements 14 in FIGS. 2A and 2B may be Hall sensor elements. In a similar manner to FIGS. 1A and 1B, a connecting line between the two sensor elements 14 may run substantially perpendicular to the bypass current path 24 and may intersect the latter. In contrast to FIGS. 1A and 1B, a connecting line between the two sensor elements 14 may run substantially parallel to the main current path 22. In the example in FIGS. 2A and 2B, such an arrangement of the sensor elements 14 can be provided by a protruding section 28 of the busbar 4. The opening 26 in the busbar 4 may be at least partially arranged in the protruding busbar section 28. The left-hand sensor element 14 may be arranged on an edge of the protruding busbar section 28 and the right-hand sensor element 14 may be arranged on an edge of the opening 26. On account of an arrangement of the sensor elements 14 relative to the main current path 22, as shown in FIGS. 2A and 2B, a disturbance of the magnetic field induced by the bypass current that is caused by the main current can be reduced in comparison with FIGS. 1A and 1B.

Figure 3A:
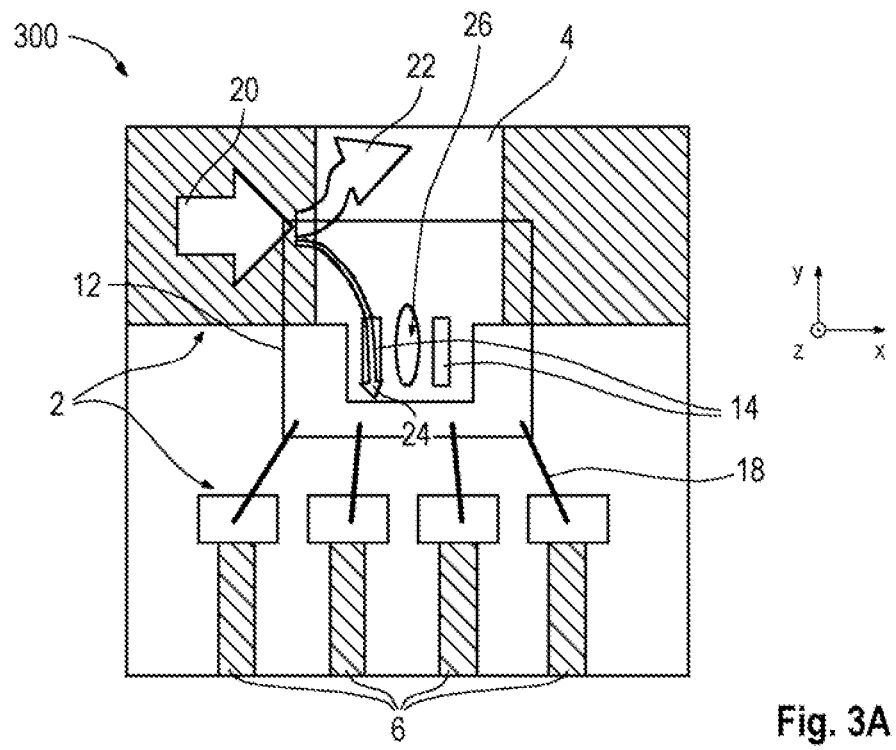
FIGS. 3A and 3B show a plan view and a view from below of a sensor apparatus 300 according to the disclosure.
Figure 3B:
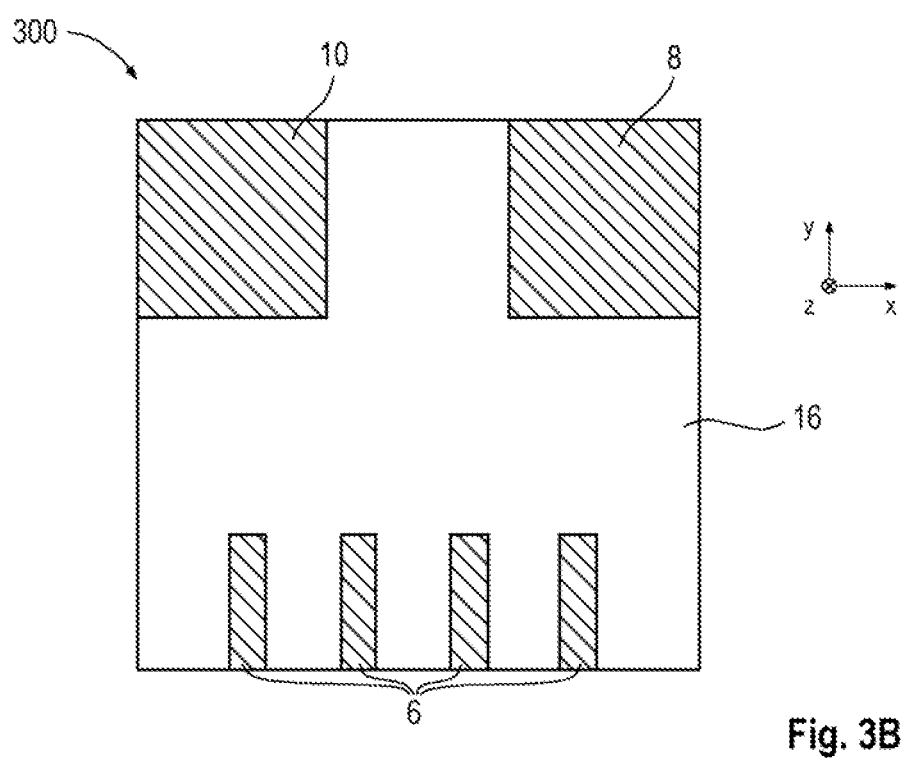

The sensor apparatus 300 in FIGS. 3A and 3B may be at least partially similar to the sensor apparatuses 100 and 200 in FIGS. 1A-2B and may have similar components. In the preceding examples in FIGS. 1A-2B, each of the sensor elements 14 could correspond to a Hall sensor element. In contrast to this, the sensor elements 14 of the sensor apparatus 300 may each correspond to a magnetoresistive sensor element or a vertical Hall sensor element or a fluxgate sensor element. The sensor elements 14 may be, for example, magnetoresistive xMR sensor elements, in particular AMR sensor elements, GMR sensor elements or TMR sensor elements. Since the sensor elements mentioned may be sensitive, in particular, to an "in-plane" magnetic field component, the sensor elements 14 may be aligned with the course of the bypass current path 24. In other words, the sensor elements 14 may be arranged directly above the bypass current path 24. That is to say, in the plan view in FIG. 3A, the bypass current path 24 and the sensor elements 14 may each overlap, in particular completely. Furthermore, the sensor elements 14 may be arranged in an offset manner with respect to the main current path 22. This makes it possible to avoid or at least reduce a disruption of the measurement of the magnetic field induced by the bypass current that is caused by the main current. In a similar manner to FIGS. 2A and 2B, a connecting line between the sensor elements 14 may run substantially parallel to the main current path 22.

Figure 4A:
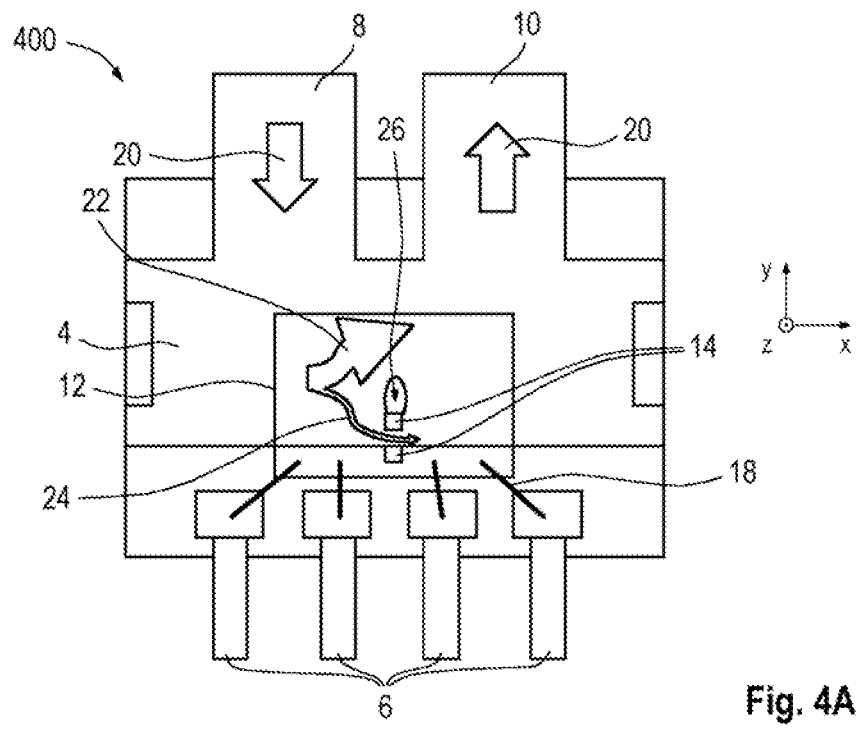
FIGS. 4A and 4B show a plan view and a view from below of a sensor apparatus 400 according to the disclosure.
Figure 4B:
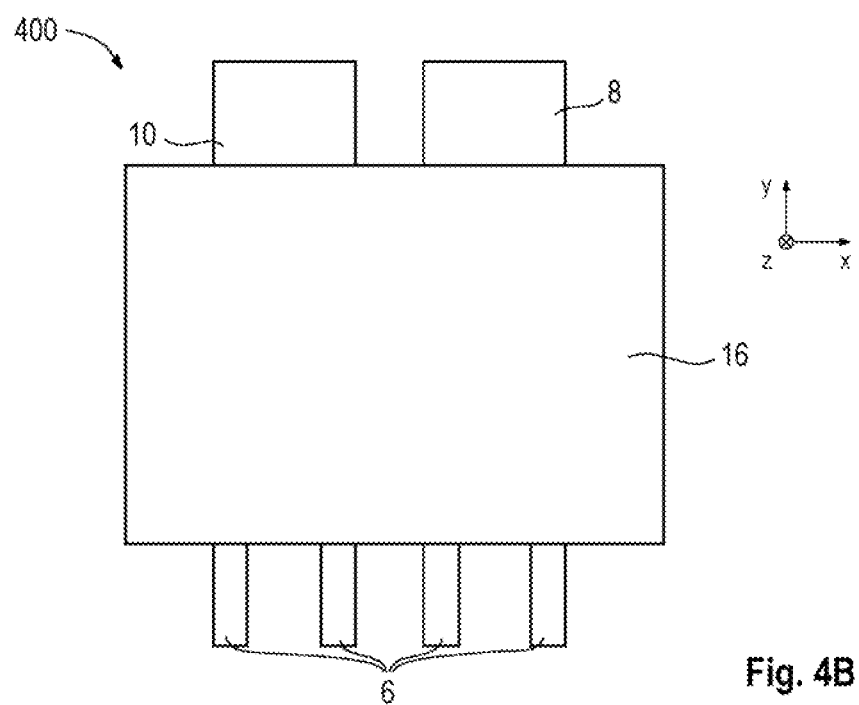

The sensor apparatus 400 in FIGS. 4A and 4B may be at least partially similar to the sensor apparatus 100 in FIGS. 1A and 1B and may have similar components. The chip carrier may be, for example, a leadframe which may have a substantially consistent thickness in the z direction. In contrast to FIGS. 1A and 1B, the connection conductors 6 and the connections 8, 10 in the example in FIGS. 4A and 4B may be formed by pins which protrude from the encapsulation material 16. In this case, the pins may protrude, in particular, from side surfaces of the sensor housing. The sensor apparatus 400 may be a "leaded" package, for example a "gullwing" package. The sensor apparatus 400 may be electrically and mechanically connected to a circuit board (not shown) via the connection conductors 6 and the connections 8, 10. In the view from below in FIG. 4B, the connection conductors 6 and the connections 8, 10 may be covered by the encapsulation material 16.

Figure 5A:
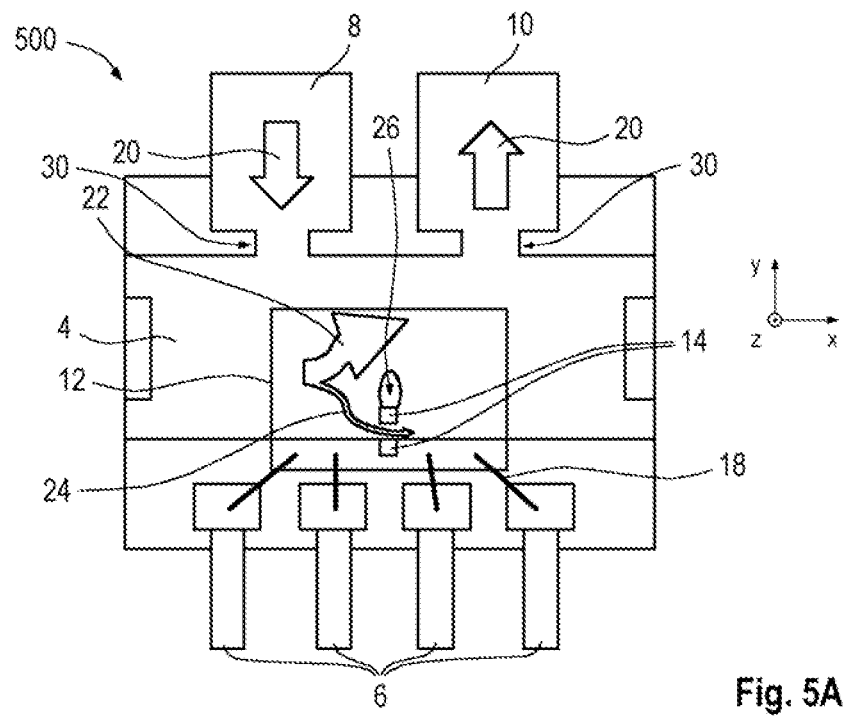
FIGS. 5A and 5B show a plan view and a view from below of a sensor apparatus 500 according to the disclosure.
Figure 5B:
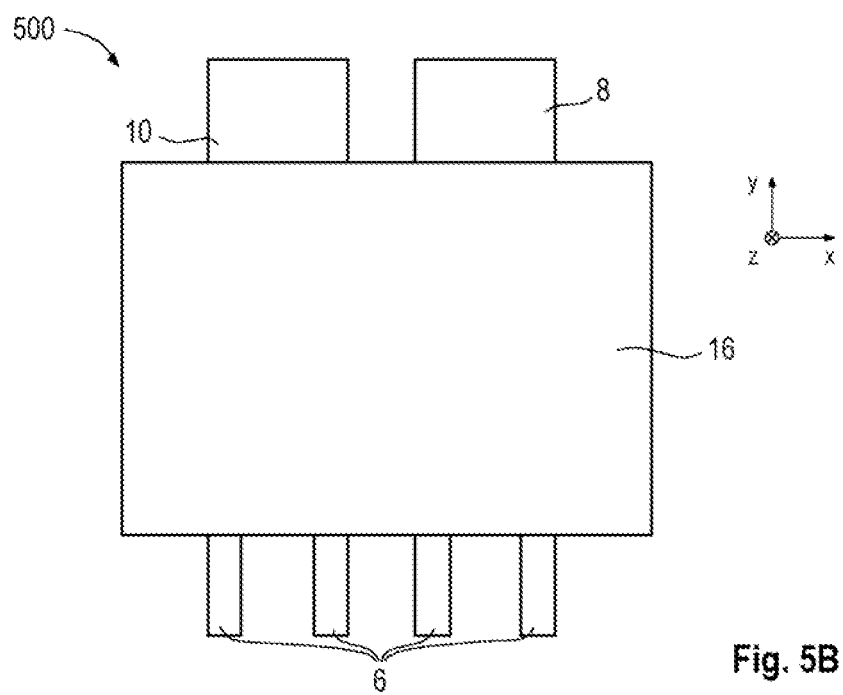

The sensor apparatus 500 in FIGS. 5A and 5B may be at least partially similar to the sensor apparatus 400 in FIGS. 4A and 4B and may have similar components. In the example in FIGS. 4A and 4B, at least one of the connections 8, 10 of the chip carrier may have a connection conductor which may be in the form of a pin. The connections 8, 10 and the associated connection conductors may have one or more tapered sections 30. In the example in FIGS. 5A and 5B, the tapered sections 30 may have a rectangular shape. In further examples, the tapered sections 30 may have different shape, for example a rounded shape or a wave shape. The tapered sections 30 can provide harmonization of the electrical current density j of the current flowing through the busbar 4. In other words, a more uniform distribution of the electrical current in the busbar 4 can be achieved.

Figure 6:
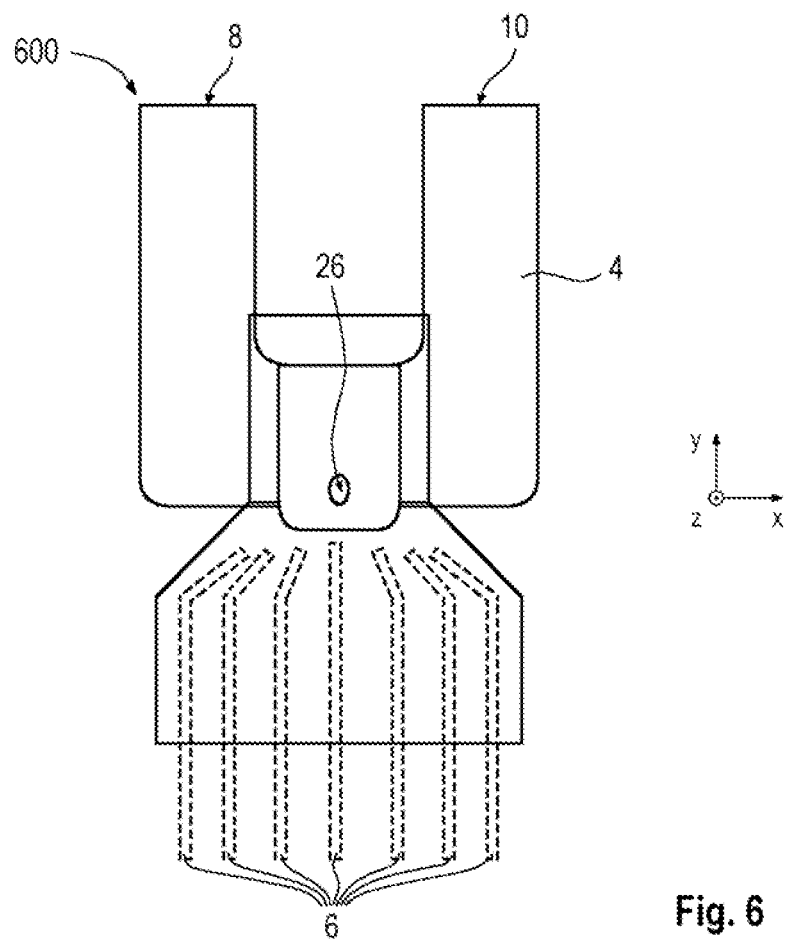
FIG. 6 shows a plan view of a sensor apparatus 600 according to the disclosure.

The sensor apparatus 600 in FIG. 6 may be at least partially similar to the sensor apparatus 400 in FIGS. 4A and 4B and may have similar components. In comparison with FIGS. 4A and 4B, the busbar 4 and the connection conductors 6 may have a different geometrical form. In FIG. 6, the busbar 4 may have a U-shaped form. The connection conductors 6 may each have a lower section and an upper section. The lower section may run in a straight line in the y direction, while the upper section may point toward the magnetic field sensor chip.

Figure 7:
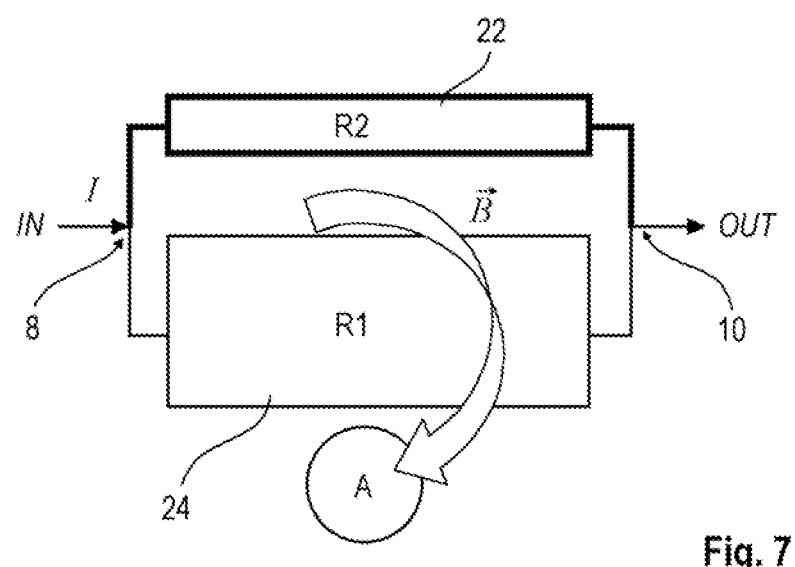
FIG. 7 shows a circuit diagram of electrical resistances which occur in a busbar according to the disclosure.

FIG. 7 shows a circuit diagram of electrical resistances which occur in a busbar according to the disclosure. At a first connection 8, an electrical current I is fed into the busbar and is divided into a main current path 22 and a bypass current path 24 and is output at a second connection 10. A magnetic field $\vec{B}$ induced by the bypass current is captured by a magnetic field sensor chip arranged above the bypass current path 24. The bypass current path 24 and the main current path 22 may have a first electrical resistance R1 and a second electrical resistance R2, respectively. The electrical resistances R1, R2 may be connected in parallel, in which case: R1>>R2. Busbars according to the disclosure having the parallel resistance scheme illustrated may have a reduced total resistance according to Ohm's law in comparison with conventional busbars in which the entire electrical current flows along only one current path.

Figure 8:
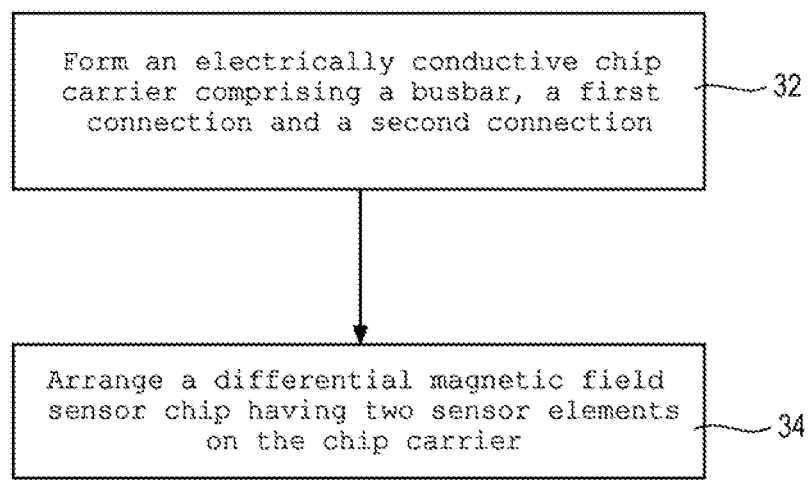
FIG. 8 shows a flowchart of a method for producing a sensor apparatus according to the disclosure.

FIG. 8 shows a flowchart of a method for producing a sensor apparatus according to the disclosure. The method can be used, for example, to manufacture any of the sensor apparatuses described herein according to the disclosure. The method can therefore be read in conjunction with any of FIGS. 1A to 6.

At 32, an electrically conductive chip carrier comprising a busbar, a first connection and a second connection may be formed. At 34, a differential magnetic field sensor chip having two sensor elements may be arranged on the chip carrier. The form of the busbar may be such that a measurement current path running from the first connection to the second connection through the busbar comprises a main current path and a bypass current path. The main current path and the bypass current path may run parallel to one another, and a bypass current flowing through the bypass current path may be less than a main current flowing through main current path. The magnetic field sensor chip may be configured to capture a magnetic field induced by the bypass current. In one example, the busbar may have no contact resistance along the bypass current path on the chip carrier.

The method may have further steps which are not described in detail for the sake of simplicity. For example, one or more of the above-described components of sensor apparatuses according to the disclosure can be provided within the scope of such steps. In one example, the measurement current path and the bypass current path may be formed by producing an opening in the busbar. In a further example, the measurement current path and the bypass current path may be formed by a leadframe production process.

EXAMPLES

Sensor apparatuses and methods for producing sensor apparatuses are explained below on the basis of examples.

Example 1 is a sensor apparatus comprising: an electrically conductive chip carrier comprising a busbar, a first connection and a second connection; and a differential magnetic field sensor chip which is arranged on the chip carrier and has two sensor elements, wherein the form of the busbar is such that a measurement current path running from the first connection to the second connection through the busbar comprises a main current path and a bypass current path, wherein the main current path and the bypass current path run parallel to one another, and a bypass current flowing through the bypass current path is less than a main current flowing through the main current path, and wherein the magnetic field sensor chip is configured to capture a magnetic field induced by the bypass current.

Example 2 is a sensor apparatus according to example 1, wherein the busbar has no contact resistance along the bypass current path on the chip carrier.

Example 3 is a sensor apparatus according to example 1 or 2, wherein the busbar is manufactured as an integral single-piece component.

Example 4 is a sensor apparatus according to one of the preceding examples, wherein the main current path and the bypass current path are separated from one another by an opening formed in the busbar.

Example 5 is a sensor apparatus according to one of the preceding examples, also comprising: an encapsulation material which at least partially encapsulates the magnetic field sensor chip and the busbar, wherein the bypass current path runs within the encapsulation material.

Example 6 is a sensor apparatus according to one of the preceding examples, wherein the magnetic field sensor chip is arranged above the bypass current path.

Example 7 is a sensor apparatus according to one of the preceding examples, wherein a connecting line between the two sensor elements runs substantially perpendicular to the bypass current path and intersects the latter.

Example 8 is a sensor apparatus according to one of the preceding examples, wherein a connecting line between the two sensor elements runs substantially parallel to the main current path.

Example 9 is a sensor apparatus according to one of examples 1 to 7, wherein a connecting line between the two sensor elements runs substantially perpendicular to the main current path.

Example 10 is a sensor apparatus according to one of the preceding examples, wherein the two sensor elements comprise two Hall sensor elements, wherein the bypass current path runs between the two Hall sensor elements.

Example 11 is a sensor apparatus according to one of examples 1 to 9, wherein the two sensor elements comprise two xMR sensor elements which are arranged above the bypass current path.

Example 12 is a sensor apparatus according to one of the preceding examples, also comprising: a switch which is configured to switch between a differential measurement mode of the magnetic field sensor chip and a non-differential measurement mode of the magnetic field sensor chip if the strength of the magnetic field induced by the bypass current exceeds a predefined threshold value.

Example 13 is a sensor apparatus according to example 12, wherein the non-differential measurement mode of the magnetic field sensor chip is provided by one of the two sensor elements.

Example 14 is a sensor apparatus according to one of the preceding examples, wherein at least one of the first and second connections of the chip carrier comprises a connection conductor, wherein the connection conductor has a tapered section.

Example 15 is a method for producing a sensor apparatus, wherein the method comprises: forming an electrically conductive chip carrier comprising a busbar, a first connection and a second connection; and arranging a differential magnetic field sensor chip having two sensor elements on the chip carrier, wherein the form of the busbar is such that a measurement current path running from the first connection to the second connection through the busbar comprises a main current path and a bypass current path, wherein the main current path and the bypass current path run parallel to one another, and a bypass current flowing through the bypass current path is less than a main current flowing through the main current path, and wherein the magnetic field sensor chip is configured to capture a magnetic field induced by the bypass current.

Example 16 is a method according to example 15, wherein the busbar has no contact resistance along the bypass current path on the chip carrier.

Example 17 is a method according to example 15 or 16, also comprising: forming the measurement current path and the bypass current path by producing an opening in the busbar.

Example 18 is a method according to one of examples 15 to 17, also comprising: forming the measurement current path and the bypass current path using a leadframe production process.

Although specific implementations are illustrated and described herein, it is clear to a person of average skill in the art that a multiplicity of alternative and/or equivalent implementations can replace the specific implementations shown and described without departing from the scope of the present disclosure. This application is intended to cover all adaptations or variations of the specific implementations discussed herein. Therefore, the intention is for this disclosure to be limited only by the claims and their equivalents.

The invention claimed is:

1. A sensor apparatus comprising:
   an electrically conductive chip carrier comprising a busbar, a first connection and a second connection; and
   a differential magnetic field sensor chip which is arranged on the electrically conductive chip carrier and has two sensor elements,
   wherein a form of the busbar is such that a measurement current path running from the first connection to the second connection through the busbar comprises a main current path and a bypass current path, wherein the main current path and the bypass current path run parallel to one another, and a bypass current flowing through the bypass current path is less than a main current flowing through the main current path, and
   wherein the differential magnetic field sensor chip is configured to capture a magnetic field induced by the bypass current.

2. The sensor apparatus as claimed in claim 1, wherein the busbar has no contact resistance along the bypass current path on the electrically conductive chip carrier.

3. The sensor apparatus as claimed in claim 1, wherein the busbar is manufactured as an integral single-piece component.

4. The sensor apparatus as claimed in claim 1, wherein the main current path and the bypass current path are separated from one another by an opening formed in the busbar.

5. The sensor apparatus as claimed in claim 1, also comprising:
   an encapsulation material which at least partially encapsulates the differential magnetic field sensor chip and the busbar, wherein the bypass current path runs within the encapsulation material.

6. The sensor apparatus as claimed in claim 1, wherein the differential magnetic field sensor chip is arranged above the bypass current path.

7. The sensor apparatus as claimed in claim 1, wherein a connecting line between the two sensor elements run substantially perpendicular to the bypass current path and intersects the bypass current path.

8. The sensor apparatus as claimed in claim 1, wherein a connecting line between the two sensor elements run substantially parallel to the main current path.

9. The sensor apparatus as claimed in claim 1, wherein a connecting line between the two sensor elements run substantially perpendicular to the main current path.

10. The sensor apparatus as claimed in claim 1, wherein the two sensor elements comprise two Hall sensor elements, wherein the bypass current path runs between the two Hall sensor elements.

11. The sensor apparatus as claimed in claim 1, wherein the two sensor elements comprise two xMR sensor elements which are arranged above the bypass current path.

12. The sensor apparatus as claimed in claim 1, further comprising:
    a switch which is configured to switch between a differential measurement mode of the differential magnetic field sensor chip and a non-differential measurement mode of the differential magnetic field sensor chip if a strength of the magnetic field induced by the bypass current exceeds a predefined threshold value.

13. The sensor apparatus as claimed in claim 12, wherein the non-differential measurement mode of the differential magnetic field sensor chip is provided by one of the two sensor elements.

14. The sensor apparatus as claimed in claim 1, wherein at least one of the first and second connections of the electrically conductive chip carrier comprises a connection conductor, wherein the connection conductor has a tapered section.

15. A method for producing a sensor apparatus, wherein the method comprises:

forming an electrically conductive chip carrier comprising a busbar, a first connection and a second connection; and arranging a differential magnetic field sensor chip having two sensor elements on the electrically conductive chip carrier, wherein a form of the busbar is such that a measurement current path running from the first connection to the second connection through the busbar comprises a main current path and a bypass current path, wherein the main current path and the bypass current path run parallel to one another, and a bypass current flowing through the bypass current path is less than a main current flowing through the main current path, and wherein the differential magnetic field sensor chip is configured to capture a magnetic field induced by the bypass current.

16. The method as claimed in claim 15, wherein the busbar has no contact resistance along the bypass current path on the electrically conductive chip carrier.

17. The method as claimed in claim 15, further comprising:

forming the measurement current path and the bypass current path by producing an opening in the busbar.

18. The method as claimed in claim 15, further comprising:

forming the measurement current path and the bypass current path using a leadframe production process.

* * * * *